United States Patent
Lee et al.

(10) Patent No.: US 9,774,332 B2
(45) Date of Patent: Sep. 26, 2017

(54) DOUBLE DATA RATE COUNTER, AND ANALOG-TO-DIGITAL CONVERTER AND CMOS IMAGE SENSOR USING THE SAME

(71) Applicant: SK hynix Inc., Gyeonggi-do (KR)

(72) Inventors: Sung-Jin Lee, Gyeonggi-do (KR); Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 525 days.

(21) Appl. No.: 14/559,443

(22) Filed: Dec. 3, 2014

(65) Prior Publication Data

US 2016/0043725 A1 Feb. 11, 2016

(30) Foreign Application Priority Data

Aug. 6, 2014 (KR) ........................ 10-2014-0101142

(51) Int. Cl.
| | |
|---|---|
| *H03K 21/02* | (2006.01) |
| *H03K 23/40* | (2006.01) |
| *H04N 5/378* | (2011.01) |
| *H03M 1/56* | (2006.01) |
| *H03M 1/12* | (2006.01) |

(52) U.S. Cl.
CPC .......... *H03K 21/026* (2013.01); *H03K 23/40* (2013.01); *H04N 5/378* (2013.01); *H03M 1/123* (2013.01); *H03M 1/56* (2013.01)

(58) Field of Classification Search
None
See application file for complete search history.

(56) References Cited

U.S. PATENT DOCUMENTS

| | | | |
|---|---|---|---|
| 8,976,052 B2* | 3/2015 | Kim ...................... | H03K 23/58 341/155 |
| 9,191,011 B2* | 11/2015 | Hwang ................ | H03K 21/026 |
| 2010/0207798 A1* | 8/2010 | Lim ...................... | H03K 21/023 341/155 |

FOREIGN PATENT DOCUMENTS

| | | |
|---|---|---|
| KR | 1020100092542 | 8/2010 |
| KR | 1020100099522 | 9/2010 |

* cited by examiner

*Primary Examiner* — Howard Williams
(74) *Attorney, Agent, or Firm* — IP & T Group LLP

(57) ABSTRACT

A Double Data Rate (DDR) counter includes an input clock control portion suitable for generating a first clock corresponding to a state of a input clock based on a counter enable signal, and an LSB control portion suitable for holding a least significant bit based on the counter enable signal and successively performing a counting operation on the first clock in multiple sections.

12 Claims, 7 Drawing Sheets

DOUBLE DATA RATE COUNTER, AND ANALOG-TO-DIGITAL CONVERTER AND CMOS IMAGE SENSOR USING THE SAME

CROSS-REFERENCE TO RELATED APPLICATIONS

The present application claims priority of Korean Patent Application No. 10-2014-0101142, filed on Aug. 6, 2014, which is incorporated herein by reference in its entirety.

BACKGROUND

1. Field

Exemplary embodiments of the present invention relate to an Image Sensor (IS), and more particularly, to a Double Data Rate (DDR) counter, and an analog-to-digital converter (ADC) and a Complementary Metal-Oxide-Semiconductor (CMOS) image sensor using the DDR counter. The DDR counter may be used for single-slope ADC of a CMOS Image Sensor (CIS) and perform the same analog-to-digital conversion function as a Single Data Rate (SDR) counter at half the clock frequency of the SDR counter.

Although a single-slope ADC is described as an example in the following embodiments, the inventive concept and technology of the present invention are not limited to this, and the technology of the present invention is applicable to multi-slope ADC or other devices employing a DDR counter.

2. Description of the Related Art

Counters are used in many electronic devices to convert physical parameters, such as light intensity, sound intensity and time, into digital signals.

For example, image sensors acquire images using properties of semiconductors that respond to incident light, and include analog-to-digital converters (ADC) that convert analog signals from a pixel array into digital signals. An ADC may be realized using a counter that performs counting operations using a dock. In other words, a single-slope ADC used for a CMOS image sensor uses a counter to convert a pulse signal into a code signal.

The operating speed and power consumption of counters have direct influence on the performance of the devices they operate in. In particular, CMOS image sensors may include counters to convert analog signals, which are outputted on a column basis from an active pixel sensor array, into digital signals. The number of counters may increase depending on the resolution of the CMOS image sensor. As the number of counters increase, the operating speed and power consumption of the counters become an important factor in determining overall performance of the CMOS image sensor.

For this reason, double data rate (DDR) counters have been developed and applied to single-slope ADCs. A DDR counter may reduce its operating speed while maintaining resolution using a single-slope ADC to reduce power consumption.

The DDR counter uses a logic high state and a logic low state of a clock as a Least Significant Bit (LSB) signal.

However, the DDR counter may cause an error of one code or more due to the relationship between the polarity of the input clock and the counting start signal.

Also, the DDR counter may consume more power due to complicated input clock controls, LSB holding controls, signals and so on.

SUMMARY

Exemplary embodiments of the present invention are directed to a Double Data Rate (DDR) counter capable of minimizing code errors based on the relationship between the polarity of an input clock and a counter enable signal, i.e., a counting start signal, and successively performing counting operations in multiple sections, and an analog-to-digital converter (ADC) and a Complementary Metal-Oxide-Semiconductor (CMOS) Image Sensor (CIS) using the DDR counter.

In other words, the embodiments of the present invention are directed to the Double Data Rate (DDR) counter capable of detecting the state of a neighboring clock of an input clock by using the rising of the counter enable signal, i.e., the counting start signal, and inverting or non-inverting the input clock by using the detected state of the neighboring clock in order to prevent a counting code error, and successively performing a counting operation in multiple sections thereof by holding the Least Significant Bit (LSB) based on the falling of the counter enable signal, and the analog-to-digital converter (ADC) and the Complementary Metal-Oxide-Semiconductor (CMOS) Image Sensor (CIS) using the DDR counter.

In accordance with an embodiment of the present invention, a Double Data Rate (DDR) counter includes an input clock control portion suitable for generating a first clock corresponding to a state of a input clock based on a counter enable signal, and a Least Significant Bit (LSB) control portion suitable for holding an LSB based on the counter enable signal and successively performing a counting operation on the first clock in multiple sections.

The input clock control portion may detect the state of a neighboring clock of the input clock based on a first edge of the counter enable signal and invert or non-invert the input clock based on a detected state of the neighboring clock.

The input clock control portion may include a counting section determination block suitable for receiving the input clock and the counter enable signal and determining a counting section, a clock sampling block suitable for sampling the state of the input clock based on the counter enable signal, and a first inversion/non-inversion block suitable for inverting or non-inverting an output of the counting section determination block based on a clock sampling result obtained from the clock sampling block and outputting the first clock to the LSB control portion.

The input clock control portion may further include a third inversion/non-inversion block suitable for inverting or non-inverting a cross-correlation double sampling output based on a control signal and outputting the counter enable signal.

The counting section determination block may include a delay unit suitable for delaying the counter enable signal, and a NAND gate suitable for performing a NAND operation on the input clock and the counter enable signal delayed in the delay unit.

The clock sampling block may include a pulse generation unit suitable for generating a pulse for sampling the input clock based on the counter enable signal, and a storing unit suitable for storing a state value of the input clock at a moment when the pulse is inputted from the pulse generation unit.

The LSB control portion may hold the LSB based on a second edge of the counter enable signal and successively perform the counting operation on the first clock in the multiple sections.

The LSB control portion may include a second inversion/non-inversion block suitable for inverting or non-inverting the first clock based on a previous LSB value of a previous counting to generate a second clock, a storing block suitable for storing a current LSB value based on the second clock, and a holding block suitable for storing and holding the current LSB value as the previous LSB value at a falling edge of the counter enable signal.

In accordance with another embodiment of the present invention, an analog-to-digital converter (ADC) includes a comparator suitable for comparing an analog signal with a reference signal and generating a comparator output signal, and a Double Data Rate (DDR) counter suitable for generating a digital signal corresponding to the analog signal based on the comparator output signal, wherein the DDR counter may include an input clock control portion suitable for controlling a state of an input clock to generate a first clock by detecting a state of a neighboring clock of the input clock based on a counter enable signal, and a Least Significant Bit (LSB) control portion suitable for holding an LSB based on the counter enable signal and successively performing a counting operation on the first clock in multiple sections.

The input clock control portion may detect the state of the neighboring clock based on a rising edge of the counter enable signal and invert or non-invert the input clock based on a detected state of the neighboring clock.

The LSB control portion may hold the LSB based on a falling edge of the counter enable signal and successively perform the counting operation on the first clock in the multiple sections.

In accordance with another embodiment of the present invention, a Complementary Metal-Oxide-Semiconductor (CMOS) Image Sensor (CIS) includes a detection portion suitable for generating an analog signal, an analog-to-digital converter suitable for comparing the analog signal with a reference signal and generating a digital signal corresponding to the analog signal using one or more Double Data Rate (DDR) counters, and a control portion suitable for controlling operations of the detection portion and the analog-to-digital converter, wherein each of the DDR counters may include an input clock control block suitable for controlling a state of an input clock to generate a first clock by detecting a state of a neighboring clock of the input clock based on a counter enable signal, and a Least Significant Bit (LSB) control block suitable for holding an LSB based on the counter enable signal and successively performing a counting operation on the first clock in multiple sections.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

It is also noted that in this specification, "connected/coupled" refers to one component not only directly coupling another component but also indirectly coupling another component through an intermediate component. In addition, 'include/comprise' or 'including/comprising' used in the specification represents that one or more components, steps, operations, and elements exist or are added. Furthermore, a singular form may include a plural form as long as it is not specifically mentioned in a sentence.

Figure 1:
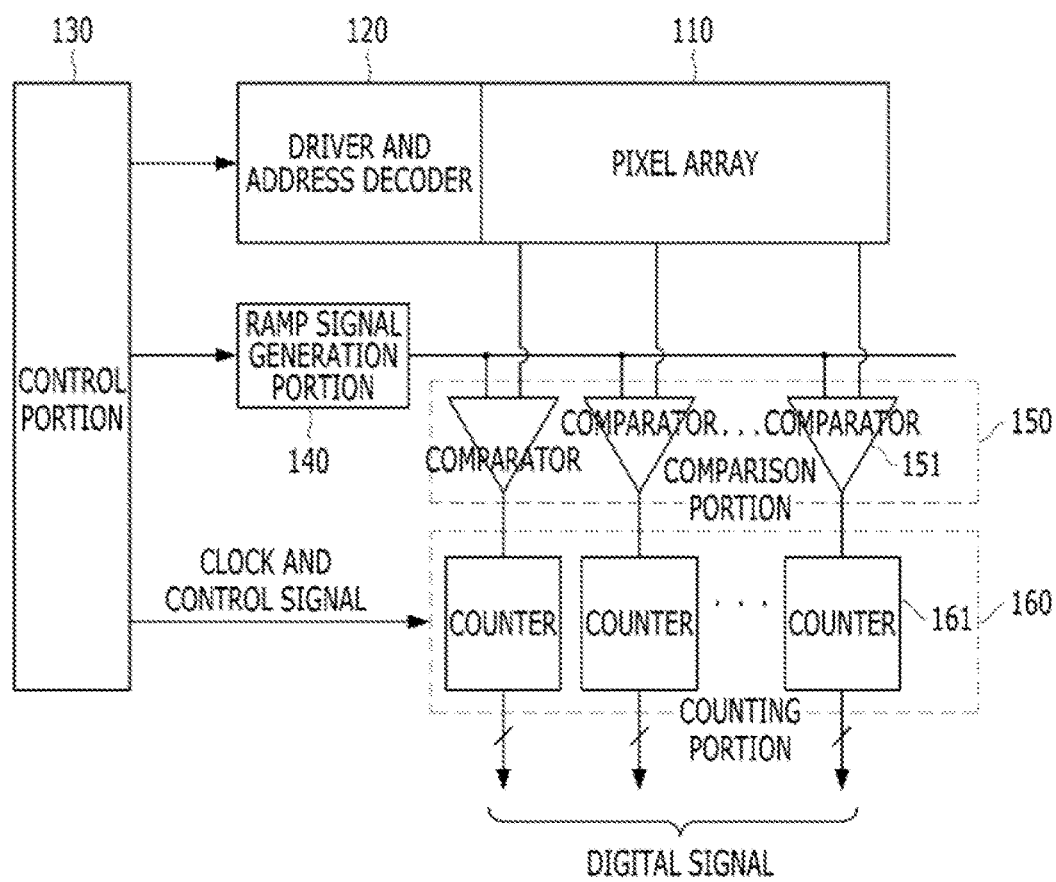
FIG. 1 is a block diagram illustrating a general Complementary Metal-Oxide-Semiconductor (CMOS) Image Sensor (CIS) presented to help understanding the embodiments of the present invention.

FIG. 1 is a block diagram illustrating a general Complementary Metal-Oxide-Semiconductor (CMOS) Image Sensor (CIS) presented to help understanding the embodiments of the present invention.

Referring to FIG. 1, the CMOS image sensor includes a pixel array 110, a driver and address decoder 120, a control portion 130, a ramp signal generation portion 140, a comparison portion 150, and a counting portion 160.

The pixel array 110 includes a plurality of pixels arranged to convert incident light into electrical analog signals based using pixels, and to output the electrical analog signals. The driver and address decoder 120 control operations of the pixel array on the basis of row and/or columns. The control portion 130 generates clock and control signals for controlling operation timing of each constituent element of the CMOS image sensor. The clock and control signals generated in the control portion 130 may include an input clock CLK, an initialization signal Init and so on. The ramp signal generation portion 140 generates ramp signals used as reference signals under the control of the control portion 130 and outputs the ramp signal to the comparison portion 150.

Analog pixel signals read from the pixel array 110 are compared with the ramp signal, which is the reference signal generated in the ramp signal generation portion 140, and counted by an analog-to-digital converter in the comparison portion 150 and the counting portion 160, and converted into digital signals. Pixel signals are outputted on a column basis. To this end, the comparison portion 150 and the counting portion 160 may include a plurality of comparators 151 and a plurality of counters 161 on a column basis. As the pixel signals of a first row are simultaneously processed in parallel through a plurality of signal process means formed on a column basis, the CMOS image sensor may operate at high speed with improved performance, in terms of both frequency band and noise.

Figure 2:
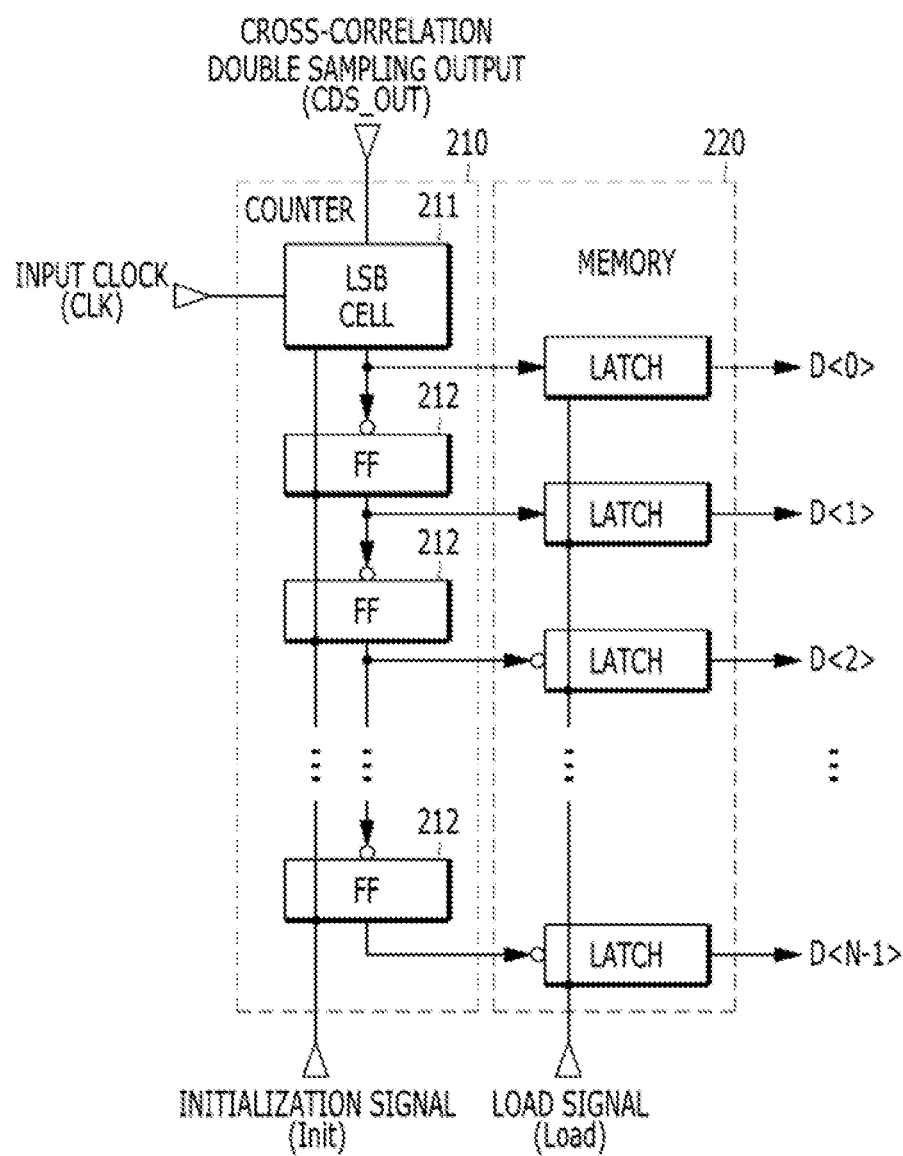
FIG. 2 is a block diagram illustrating a general counter presented to help understanding the embodiments of the present invention.

FIG. 2 is a block diagram illustrating a general counter presented to help understanding an embodiment of the present invention.

Referring to FIG. 2, a counter 210 includes a Least Significant Bit (LSB) cell block 211, and (n−1) flip flops FF 212. The Least Significant Bit (LSB) cell block 211 is initialized based on the initialization signal Init generated in the control portion 130, receives the input clock CLK from the control portion 130 and a cross-correlation double sampling output CDS_OUT from the comparator 151 and determines an LSB. The (n–1) flip flops FF 212 receive an output of the LSB cell block 211 and output the value of each bit of the output. A memory 220 may be formed to store a counting result in the rear of the counter 210. The memory 220 may include (n) latches that receive a load signal Load from the control portion 130.

However, a Double Data Rate (DDR) counter capable of operating at high speed by decreasing clock frequency by half is required as CMOS image sensors of with high pixel density and high-speed output are demanded.

A logic high state and a low state of a clock are used as an LSB signal in a typical DDR counter.

The typical DDR counter may cause errors in one code or more based on the relationship between the polarity of an input clock and a counting start signal and additional power consumption due to complicated input clock controls, LSB holding controls, signals and so on.

To remove such concerns, the DDR counter in accordance with the embodiment of the present invention detects the state of a neighboring clock of an input clock by using the rising of a counter enable signal i.e., the counting start signal, and inverts or non-inverts the input clock by using the detected neighboring clock state in order to prevent a counting code error and it successively performs a counting operation in multiple sections thereof by holding the LSB based on the falling of the counter enable signal.

Figure 3:
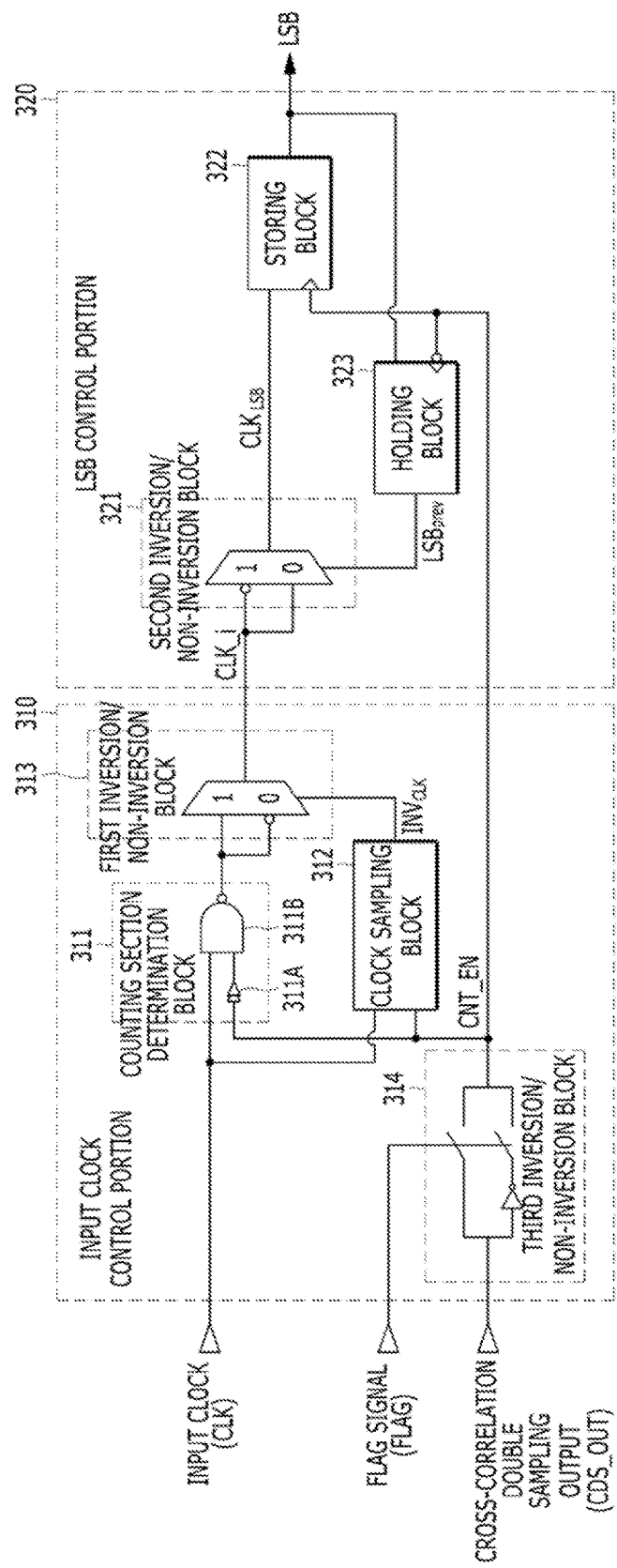
FIG. 3 is a block diagram illustrating a Double Data Rate (DDR) counter in accordance with an embodiment of the present invention.

FIG. 3 is a block diagram illustrating a DDR counter in accordance with an embodiment of the present invention.

Referring to FIG. 3, the DDR counter includes an input clock control portion 310, and an LSB control portion 320. The input clock control portion 310 controls the state of an input clock by detecting the state of a neighboring clock of the input block based on a counter enable signal, i.e., a counting start signal. The LSB control portion 320 holds a least significant bit based on the counter enable signal and successively performs a counting operation on a first clock, generated in the input clock control portion 310, in multiple sections.

The input clock control portion 310 detects a neighboring clock state by using the rising of the counter enable signal, i.e., the counting start signal, and inverts or non-inverts an input clock by using the detected neighboring clock state so that a counting code error of the DDR counter may be prevented.

The LSB control portion 320 may hold the LSB by using the falling of the counter enable signal and successively count the first clock generated in the input clock control portion 310 in the multiple sections.

To sum up, the structure and operation method of the DDR counter in accordance with the embodiment of the present invention are as follows.

First, a counting operation is controlled to start at a first edge of an input clock CLK after the rising edge of a counting start signal CNT_EN is generated in order to minimize code errors based on the relationship between an input clock polarity of the DDR counter and the counting start signal CNT_EN.

Secondly, when a counting operation is successively performed, the LSB needs to be held. A multiple section successive counting operation is controlled to be performed without an additional signal other than the counting start signal CNT_EN by sampling an LSB state through the falling edge of the counting start signal CNT_EN.

Thirdly, when the input clock CLK is sampled, clock toggling is minimized as the rising edge of the counting start signal CNT_EN is used. When the counting start signal CNT_EN is at a logic low level, wasteful consumption of power is minimized by blocking the input clock CLK.

The structure and operation of the DDR counter in accordance with the embodiment of the present invention are described in detail with reference to FIGS. 3 to 6B.

The input clock control portion 310 outputs a first clock CLK_i to the LSB control portion 320 so that a first counting operation of the input clock CLK begins at a first edge of the input clock CLK regardless of the polarity of the input clock CLK by sampling the polarity of the input clock CLK based on the counting start signal CNT_EN and inverting or non-inverting the input clock CLK to prevent a counting code error.

To this end, the input clock control portion 310 includes a counting section determination block 311, a clock sampling block 312, and a first inversion/non-inversion block 313. The counting section determination block 311 receives the input clock CLK and the counting start signal CNT_EN and determines a counting section. The clock sampling block 312 samples the polarity of the input clock CLK based on the counting start signal CNT_EN to determine the polarity of the input clock CLK. The first inversion/non-inversion block 313 outputs the first clock CLK_i to the LSB control portion 320 by inverting or non-inverting an output of the counting section determination block 311 based on a clock sampling result $INV_{CLK}$ generated from the clock sampling block 312. The first inversion/non-inversion block 313 may be realized using a multiplexer MUX.

The input clock control portion 310 may further include a third inversion/non-inversion block 314 for outputting the counting start signal CNT_EN by inverting or non-inverting a cross-correlation double sampling output CDS_OUT generated in the comparator 151 based on a control signal, e.g., a flag signal FLAG, generated in the control portion 130. The third inversion/non-inversion block 314 is an additional constituent element required when an up-counting operation is performed.

The counting section determination block 311 includes a delay unit 311A for delaying the counting start signal CNT_EN outputted from the third inversion/non-inversion block 314, and a NAND gate 311B for performing a NAND operation on the input clock CLK generated in the control portion 130 and the counting start signal CNT_EN delayed in the delay unit 311A. The delay unit 311A may be realized using a plurality of buffers.

Figure 4:
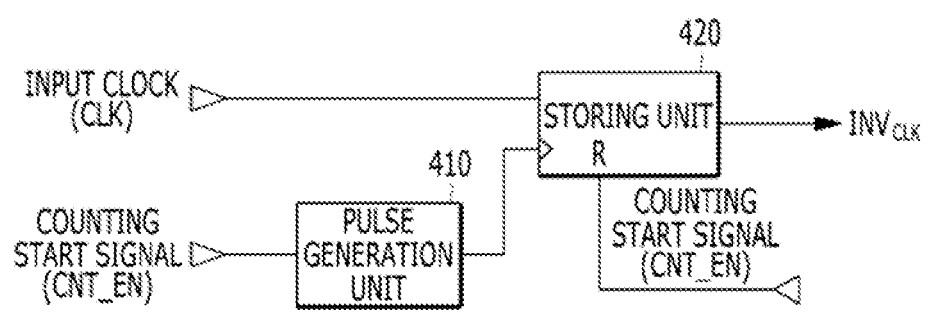
FIG. 4 is a block diagram illustrating a clock sampling block shown in FIG. 3.

Referring to FIG. 4, the clock sampling block 312 includes a pulse generation unit 410 for generating a pulse for sampling the input clock CLK based on the counting start signal CNT_EN, and a storing unit 420 for storing the state value, i.e., the value of a logic high level or the value of a logic low level, of the input clock CLK at a moment when the pulse is inputted from the pulse generation unit 410. For example, the pulse may have a width as short as the input clock CLK. The storing unit 420 may be realized using a latch that is reset based on the counting start signal CNT_EN.

Figure 5A:
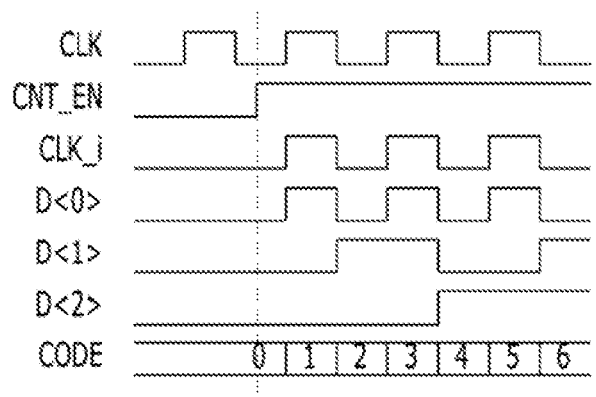
FIGS. 5A and 5B are timing diagrams illustrating an operation of the DDR counter when a counting operation starts.
Figure 5B:
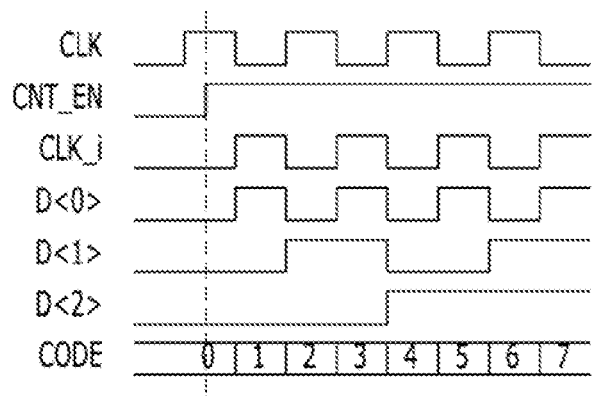

An operation of the input clock control portion 310 is described in detail with reference to FIGS. 5A and 5B.

When the counting start signal CNT_EN is at a logic low level, the input clock CLK is blocked by the NAND gate 311B. Since the clock sampling result $INV_{CLK}$ is '0', the first clock CLK_i is a logic low state.

When the input clock CLK is a logic low state at the rising of the counting start signal CNT_EN, the clock sampling result $INV_{CLK}$ maintains '0', and the first clock CLK_i which is an output of the first inversion/non-inversion block 313 is the same as the input clock CLK. In other words, the first clock CLK_i maintains a logic low state (refer to FIG. 5A).

When the input clock CLK is a logic high state at the rising of the counting start signal CNT_EN the clock sampling result $INV_{CLK}$ becomes '1', and the first clock CLK_i which is an output of the first inversion/non-inversion block 313 has an inverted state of the input clock CLK. In other words, the first clock CLK_i maintains a logic low state (refer to FIG. 5B).

As described above, the first clock CLK_i maintains a logic low state at the rising of the counting start signal CNT_EN, and then toggles based on the edge of the input clock CLK generated thereafter.

Therefore, the first clock CLK_i has the same logic state regardless of the polarity of the input clock CLK at the rising of the counting start signal CNT_EN and starts to perform the counting operation at the LSB based on the logic state.

The LSB control portion 320 holds a previous LSB value LSBprev, i.e., the LSB value of the previous counting, based on the counting start signal CNT_EN and makes a second clock $CLK_{LSB}$ the same as the previous LSB value LSBprev to perform a multiple section successive counting operation. The LSB control portion 320 samples the LSB value through the falling edge of the counting start signal CNT_EN.

To this end, the LSB control portion 320 includes a second inversion/non-inversion block 321, a storing block 322, and a holding block 323. A second inversion/non-inversion block 321 inverts or non-inverts the first clock CLK_i generated in the input clock control portion 310 based on the previous LSB value LSBprev generated from the holding block 323. The storing block 322 stores a current LSB value based on the second clock $CLK_{LSB}$ generated in the second inversion/non-inversion block 321. The holding block 323 stores and holds the current LSB value stored in the storing block 322 as the previous LSB value LSBprev at the falling edge of the counting start signal CNT_EN. The second inversion/non-inversion block 321 may be realized using a multiplexer MUX, and the storing block 322 and the holding block 323 may be realized using a latch operating based on the counting start signal CNT_EN.

Figure 6A:
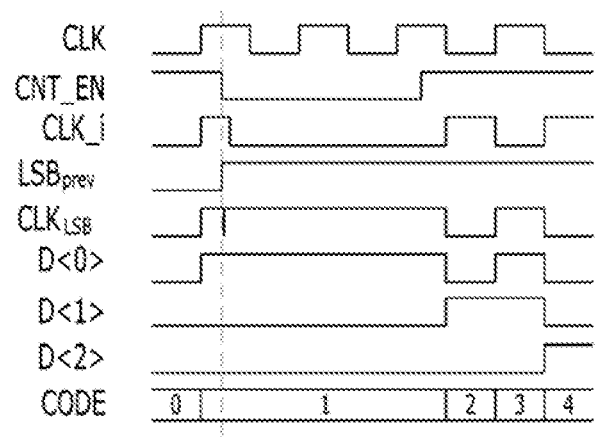
FIGS. 6A and 6B are timing diagrams illustrating an operation of the DDR counter when a counting operation ends.
Figure 6B:
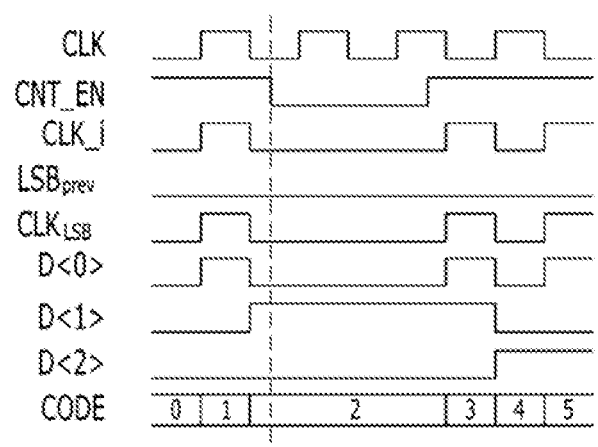

An operation of the LSB control portion 320 is described in detail with reference to FIGS. 6A and 6B.

The LSB control portion 320 stores and holds the LSB value D<0> as the previous LSB value LSBprev based on the counting start signal CNT_EN at the falling of the counting start signal CNT_EN.

When the previous LSB value LSBprev is of a logic high level, the second clock $CLK_{LSB}$ which is an output of the second inversion/non-inversion block 321 becomes an inverted state of the first clock CLK_i. An initial value of the second clock $CLK_{LSB}$ has the same logic high level as the LSB value D<0> (refer to FIG. 6A).

When the previous LSB value LSBprev is of a logic low level, the second clock $CLK_{LSB}$ which is an output of the second inversion/non-inversion block 321 becomes a non-inverted state of the first clock CLK_i. An initial value of the second clock $CLK_{LSB}$ has the same logic low level as the LSB value D<0> (refer to FIG. 6B).

When the counting start signal CNT_EN is of a logic high level, and the first clock CLK_i toggles, a counting operation is performed.

Figure 7:
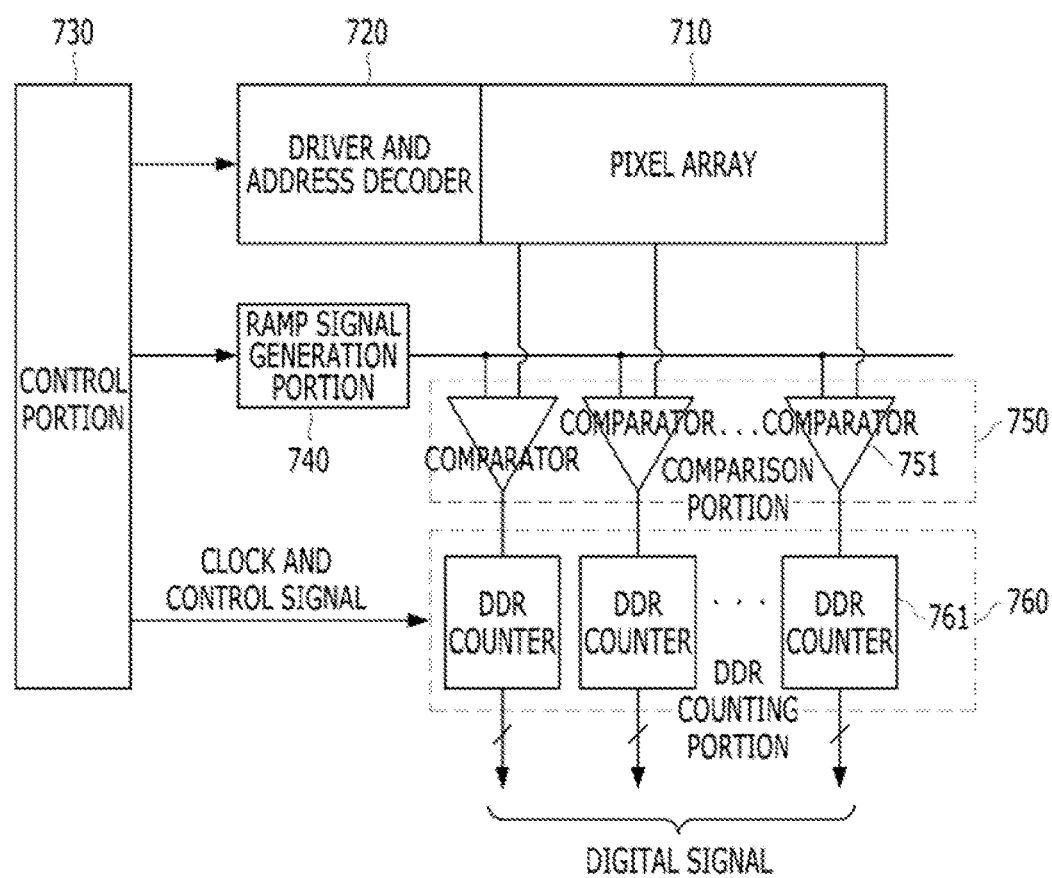
FIG. 7 is a block diagram illustrating a CMOS image sensor in accordance with an embodiment of the present invention.

FIG. 7 is a block diagram illustrating a CMOS image sensor in accordance with an embodiment of the present invention.

Referring to FIG. 7, the CMOS image sensor includes a pixel array 710, a driver and address decoder 720, a control portion 730, a ramp signal generation portion 740, a comparison portion 750, and a Double Data Rate (DDR) counting portion 760.

The pixel array 710 includes a plurality of pixels arranged to convert incident light into electrical analog signals and to output the electrical analog signals. The driver and address decoder 720 controls operations of the pixel array on the basis of rows and/or columns. The control portion 730 generates a clock and a control signal for controlling operation timing of each constituent element of the CMOS image sensor. The clock and control signals generated in the control portion 730 may include a clock CLK, an initialization signal Init, a flag signal FLAG and so on. The ramp signal generation portion 740 generates a ramp signal used as a reference signal under the control of the control portion 730 and outputs the ramp signal to the comparison portion 750.

An analog pixel signal read from the pixel array 710 is compared with the ramp signal, which is the reference signal generated in the ramp signal generation portion 740, and counted by an analog-to-digital converter realized as the comparison portion 750 and the DDR counting portion 760, and it is converted into a digital signal. A plurality of pixel signals are outputted on a column basis. To this end, the comparison portion 750 and the DDR counting portion 760 may include a plurality of comparators 751 and a plurality of DDR counters 761 on a column basis, respectively. As the pixel signals of a first row are simultaneously processed in parallel through a plurality of signal process means formed on a column basis, the CMOS image sensor may operate at high speed with improved performance in terms of a frequency band or noise.

The pixel array 710 sequentially outputs a first analog signal indicating a reset component for a cross-correlation double sampling process and a second analog signal indicating an image signal component including the reset component, and an analog-to-digital converter realized as the comparison portion 750. The DDR counting portion 760 digitally carries out a cross-correlation double sampling process, i.e., a Digital Double Sampling (DDS) process, based on the first and second analog signals. The DDS process is used to remove the deviation between columns of a single-slope analog-to-digital converter having a column parallel structure.

The analog-to-digital converter counts the first analog signal indicating the reset component and the second analog signal indicating the image signal component. A digital signal corresponding to the difference between the first analog signal and the second analog signal is generated based on two counting results. Each of two counting processes is carried out in the manner of the DDR counting as described above.

In accordance with the embodiments of the present invention, a counting code error of the DDR counter may be prevented by detecting the state of a neighboring clock of an input clock based on the rising of a counter enable signal, i.e., a counting start signal, and inverting or non-inverting the input clock based on the detected state of the neighboring clock.

Also, in accordance with the embodiments of the present invention, multiple sections of the DDR counter may be successively counted based on a logic high or a low level of the counter enable signal by holding the Least Significant Bit (LSB) based on the falling of the counter enable signal.

Also, in accordance with the embodiments of the present invention, the DDR counter may be controlled in the same manner as a Single Data Rate (SDR) counter without an additional control signal.

Also, in accordance with the embodiments of the present invention, clock toggling may be minimized since a clock is sampled based on the rising edge of the counter enable signal. When the counter enable signal is at a logic low level, wasteful consumption of power is minimized by blocking the clock.

While the present invention has been described with respect to specific embodiments, the embodiments are not intended to be restrictive, but rather descriptive. Further, it is noted that the present invention may be achieved ire various ways through substitution, change, and modification, by those skilled in the art without departing from the scope of the present invention as defined by the following claims.

What is claimed is:

1. A Double Data Rate DDR counter, comprising:
    an input clock control portion suitable for generating a first clock corresponding to a state of a input clock based on a counter enable signal; and
    a Least Significant Bit (LSB) control portion suitable for holding an LSB based on the counter enable signal and successively performing a counting operation on the first clock in multiple sections.

2. The DDR counter of claim 1, wherein the input clock control portion detects the state of a neighboring clock of the input clock based on a first edge of the counter enable signal and inverts or non-inverts the input clock based on a detected state of the neighboring clock.

3. The DDR counter of claim 1, wherein the input clock control portion includes:
    a counting section determination block suitable for receiving the input clock and the counter enable signal and determining a counting section;
    a clock sampling block suitable for sampling the state of the input clock based on the counter enable signal; and
    a first inversion/non-inversion block suitable for inverting or non-inverting an output of the counting section determination block based on a clock sampling result obtained from the clock sampling block and outputting the first clock to the LSB control portion.

4. The DDR counter of claim 3, wherein the input clock control portion further includes:
    a third inversion/non-inversion block suitable for inverting or non-inverting a cross-correlation double sampling output based on a control signal and outputting the counter enable signal.

5. The DDR counter of claim 3, wherein the counting section determination block includes:
    a delay unit suitable for delaying the counter enable signal; and
    a NAND gate suitable for performing a NAND operation on the input clock and the counter enable signal delayed in the delay unit.

6. The DDR counter of claim 3, wherein the clock sampling block includes:
    a pulse generation unit suitable for generating a pulse for sampling the input clock based on the counter enable signal; and
    a storing unit suitable for storing a state value of the input clock at a moment when the pulse is inputted from the pulse generation unit.

7. The DDR counter of claim 1, wherein the LSB control portion holds the LSB based on a second edge of the counter enable signal and successively performs the counting operation on the first clock in the multiple sections.

8. The DDR counter of claim 1, wherein the LSB control portion includes:
    a second inversion/non-inversion block suitable for inverting or non-inverting the first clock based on a previous LSB value of a previous counting operation to generate a second clock;
    a storing block suitable for storing a current LSB value based on the second clock; and
    a holding block suitable for storing and holding the current LSB value as the previous LSB value at a falling edge of the counter enable signal.

9. An analog-to-digital converter (ADC), comprising:
    a comparator suitable for comparing an analog signal with a reference signal and generating a comparator output signal; and
    a Double Data Rate (DDR) counter suitable for generating a digital signal corresponding to the analog signal based on the comparator output signal,
    wherein the DDR counter includes:
        an input clock control portion suitable for controlling a state of an input clock to generate a first clock by detecting a state of a neighboring clock of the input clock based on a counter enable signal; and
        a Least Significant Bit (LSB) control portion suitable for holding an LSB based on the counter enable signal and successively performing a counting operation on the first clock in multiple sections.

10. The ADC of claim 9, wherein the input clock control portion detects the state of the neighboring clock based on a rising edge of the counter enable signal and inverts or non-inverts the input clock based on a detected state of the neighboring clock.

11. The ADC of claim 10, wherein the LSB control portion holds the LSB based on a falling edge of the counter enable signal and successively performs the counting operation on the first clock in the multiple sections.

12. A Complementary Meta Oxide-Semiconductor (CMOS) Image Sensor (CIS), comprising:
    a detection portion suitable for generating an analog signal;
    an analog-to-digital converter suitable for comparing the analog signal with a reference signal and generating a digital signal corresponding to the analog signal using one or more Double Data Rate (DDR) counters; and
    a control portion suitable for controlling operations of the detection portion and the analog-to-digital converter,
    wherein each of the DDR counters includes:
        an input clock control block suitable for controlling a state of an input clock to generate a first clock by detecting a state of a neighboring clock of the input clock based on a counter enable signal; and
        a Least Significant Bit (LSB) control block suitable for holding an LSB based on the counter enable signal and successively performing a counting operation on the first clock in multiple sections.

* * * * *